(12) United States Patent
Ossimitz et al.

(10) Patent No.: US 9,871,017 B2
(45) Date of Patent: Jan. 16, 2018

(54) MULTI-LEVEL CHIP INTERCONNECT

(71) Applicant: Infineon Technologies AG, Neubiberg (DE)

(72) Inventors: Peter Ossimitz, Munich (DE); Tobias Jacobs, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/986,727

(22) Filed: Jan. 4, 2016

(65) Prior Publication Data

US 2017/0194288 A1    Jul. 6, 2017

(51) Int. Cl.

| | |
|---|---|
| *H01L 25/065* | (2006.01) |
| *H01L 23/522* | (2006.01) |
| *H01L 23/528* | (2006.01) |
| *H01L 23/31* | (2006.01) |
| *H01L 23/532* | (2006.01) |
| *H01L 21/66* | (2006.01) |
| *H01L 25/00* | (2006.01) |
| *H01L 21/768* | (2006.01) |

(52) U.S. Cl.
CPC .... *H01L 25/0652* (2013.01); *H01L 21/76877* (2013.01); *H01L 22/32* (2013.01); *H01L 23/3171* (2013.01); *H01L 23/528* (2013.01); *H01L 23/5226* (2013.01); *H01L 23/53219* (2013.01); *H01L 23/53228* (2013.01); *H01L 25/50* (2013.01); *H01L 2225/06513* (2013.01)

(58) Field of Classification Search
CPC .......... H01L 24/02–24/04; H01L 24/01; H01L 23/538; H01L 23/5383; H01L 23/5385; H01L 23/5386; H01L 23/5226; H01L 23/49833; H01L 22/30; H01L 22/32; H01L 23/528; H01L 23/5283; H01L 23/5221; H01L 25/0652; H05K 3/3415
See application file for complete search history.

(56) References Cited

U.S. PATENT DOCUMENTS

| | | | |
|---|---|---|---|
| 5,543,586 A * | 8/1996 | Crane, Jr. et al. ....... | H05K 1/02 174/262 |
| 9,013,038 B2 * | 4/2015 | Chen ..................... | H01L 24/11 257/734 |

* cited by examiner

*Primary Examiner* — Jose R Diaz
(74) *Attorney, Agent, or Firm* — Slater Matsil, LLP

(57) ABSTRACT

Representative implementations of devices and techniques provide optimized electrical performance of interconnectivity components of multi-layer integrated circuits (IC) such as chip dice, for example. Different layers of the multi-layer IC include contact terminals that may be used to connect to circuits, systems, and carriers external to the IC.

32 Claims, 8 Drawing Sheets

MULTI-LEVEL CHIP INTERCONNECT

BACKGROUND

Integrated circuits (IC) including highly integrated devices such as a system-on-chip (SOC) devices, for example, commonly use the last metal layer of the device (e.g., often the top level of the device during manufacturing) for formation of terminals or connections for the device. This last metal layer becomes an interconnect layer for temporarily or permanently interconnecting the IC with other carriers, printed circuit boards, systems, or components. For example, contact pads for wafer testing, terminals for wire bonding, and contact bumps for "flip chip" connections are often implemented as part of the same last metal interconnect layer.

In many cases the last metal interconnect layer is comprised of an aluminum alloy, copper, or like materials. For some processes, such as wafer testing for example, a metal alloy is a preferred material for contact formation. For other processes, such as flip chip contact bumps for example, copper is a preferred material to form the contacts upon. However, in general one material or another is used for the interconnect layer, for all of the contact types. Consequently, manufacturers often experience some trade-offs in selecting the final interconnect layer material.

In other cases, the top metal layers can be used for power distribution. To increase the current capability, the upper layers can be formed to be thicker than the lower layers, for example. This can result in wide design rules to connect the bottom layers to the top layer. In the case of a system-in-package (SIP) configuration, for instance, many signal pins may be connected directly to the lower level metal layer from the upper or top layer. This enables a more direct signal path and can allow for improved design rules in the top layer(s) for lateral routing between interconnect bumps. Such a configuration can support an increased current capability within the SIP.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Figure 1:
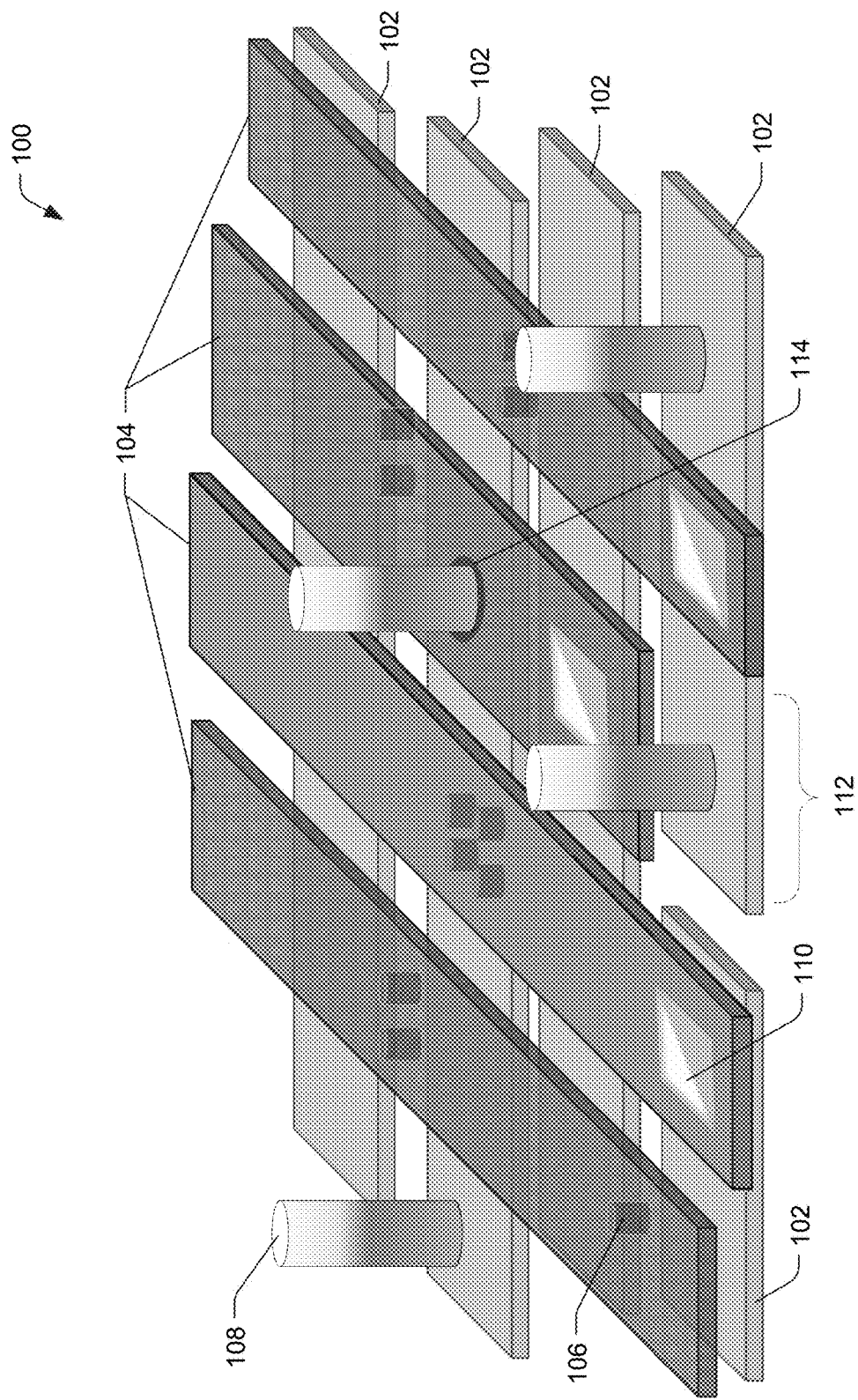
FIG. 1 is a perspective view of a multi-layer IC arrangement, including interconnect components, according to an example implementation.

Representative implementations of devices and techniques provide optimized electrical performance of interconnectivity components of multi-layer integrated circuits (IC) such as chip dice, for example. In the implementations, the multi-layer IC is arranged to include a stack of conductive layers. For example, the stack of conductive layers includes two or more layers of conductive material (e.g., metallization layers, etc.) arranged such that the layers are positioned one above another, in an overlapping arrangement. Different conductive layers of the stack of layers that make up the multi-layer IC have contact terminals that may be used to connect the IC to circuits, systems, carriers, and the like, external to the IC. The optimized interconnectivity techniques and components described herein may also be arranged to improve mechanical and/or thermal performance of the chip interconnects, as well as improving manufacturing processes.

In an implementation, contact terminals on various conductive layers of the multi-layer IC may be externally accessed concurrently. For example, openings are available to provide access to some contact terminals (e.g., test points, etc.) on some layers, while other contact terminals (such as flip-chip bumps, etc.) extend or protrude through one or more conductive layers of the IC, as well as through coatings or an enclosure of the IC, if present. In another example, terminal pads on a top level for wire bonding, or the like, may make connection to contact terminals at one or more conductive layers of the multi-layer IC, including lower layers of the stack.

In one implementation, one or more layers of the stack of conductive layers comprise metallic tracks. In various examples, the arrangement of the metallic tracks creates one or more openings, such as spaces, for example, where interconnect contacts (e.g., a flip-chip bump, or the like) may extend from a lower layer to the top of the stack, through the openings. In other implementations, one or more conductive layers of the stack may include openings such as holes, apertures, orifices, or the like, where interconnect contacts may extend from a lower layer to the top of the stack, though the openings, without making contact with the layer(s) passed through.

In various implementations, the conductive layers of the IC may be comprised of differing materials, or a variety of metallization materials. For example, in the case of a multi-layer IC having three or more conductive layers, some of the layers may be constructed of one material (copper, for instance), and others may be constructed of another material (aluminum-alloy, for instance). Since some of the layers may include terminal contacts, in some implementations, terminal contacts from different layers comprised of different materials are concurrently accessible for external contact.

Various implementations and arrangements are discussed with reference to electrical and electronics components and varied carriers. While specific components (i.e., integrated circuit chip dice, etc.) are mentioned, this is not intended to be limiting, and is for ease of discussion and illustrative convenience. The techniques and devices discussed with reference to a chip die are applicable to any type or number of electrical components (e.g., sensors, transistors, diodes, etc.), circuits (e.g., integrated circuits, mixed circuits, ASICS, memory devices, processors, etc.), groups of components, packaged components, structures, and the like, that may be arranged as a layered unit and intended to interface with external circuits, systems, carriers, and the like.

Implementations are explained in more detail below using a plurality of examples. Although various implementations and examples are discussed here and below, further implementations and examples may be possible by combining the features and elements of individual implementations and examples.

Example Arrangement

FIG. 1 is a perspective view of a multi-layer IC arrangement 100, according to an example implementation. The arrangement 100 represents an example environment whereby the techniques and devices discussed herein may be applied. The techniques, components, and devices described herein with respect to the arrangement 100 are not limited to the illustrations in FIGS. 1-6, and may be applied to other designs, types, arrangements, and constructions including other electrical components without departing from the scope of the disclosure. In some cases, alternative components may be used to implement the techniques described herein. In various implementations, the arrangement 100 may be a stand-alone unit, or it may be a portion of a system, component, structure, or the like. For example, the techniques described herein may be applied to multiple arrangements 100 while they are grouped on a wafer, or the like.

As shown in FIG. 1, the IC arrangement 100 may include two or more conductive layers ("layers") (102, 104). In some implementations, the IC arrangement 100 may include many layers 102, 104; however, two layers (102 and 104) are illustrated in FIG. 1 for clarity. As shown in FIG. 1, the layers 102, 104 are in a stacked arrangement, where one layer (104) is disposed (i.e., positioned, located, situated, etc.) over another layer (102). As mentioned above, in various implementations, one layer (102) may be comprised of a first conductive material (copper, for example) and the other layer (104) may be comprised of a second conductive material (aluminum-alloy, for example). In an arrangement 100 having more than two layers, the layers may be constructed of two, three, or more conductive materials. The order of the layers 102, 104 in the stack, and their respective construction materials is not intended to be limiting, but is for ease of discussion.

As shown in FIG. 1, in some implementations, the layers 102, 104 are arranged as traces, or the like. A pattern of first traces representing a first layer (102) may be insulated from a pattern of second traces representing a second layer (104) by an insulating layer (see 304 of FIG. 3, for example), or the like. In some implementations, as shown in FIG. 1, one or more of the layers 102, 104 may include vias 106 extending from one layer 102, 104 to another layer of the stack. The vias 106 may create electrical connections from the one layer 102, 104 to the other layer through one, two, or more intermediate layers of the stack, including through insulating layers, and the like.

As also shown in FIG. 1, in some implementations, the layers 102, 104 may include contact terminals 108, 110 electrically and mechanically coupled to the layers 102, 104. Several layers 102, 104 of the IC arrangement 100 may each include contact terminals 108, 110 coupled to the layers 102, 104. In the implementations, the contact terminals 108, 110 allow electrical access to the layers 102, 104 from an entity external to the IC 100. For example, contact terminals 108, such as flip-chip bumps, and the like, provide external (electrical) access to the layer 102 (in the illustrated example of FIG. 1) for coupling the IC 100 to a printed circuit board (PCB), interconnecting to an interposer or other carrier, and so forth. Additionally, contact terminals 108 may provide external access to the layer 102 (in the illustrated example of FIG. 1) for wire bond terminal connections, package interconnections, die to die interconnects, and the like.

In another example, contact terminals 110 may provide external access to one or more of the layers 102, 104 for probe needles during wafer testing, and the like. Alternately, contact terminals 110 may be arranged to form electrical bonds between two or more layers at strategic circuit locations. For example, a contact pad 110 on one layer 104 may be down-set to be coupled to another layer 102 at one or more points. In other implementations, the contact terminals 108, 110 may be used for external contact in numerous ways.

In various implementations, the contact terminals 108, 110 are concurrently externally accessible (either temporarily or permanently accessible). For example, the contact terminals 108 and 110 may be concurrently electrically accessible, although they are coupled to different layers 102, 104 of the stack, based on the techniques described herein. In an implementation, the contact terminals 108, 110 may be externally accessible by more than one external circuit (e.g., chip, die, carrier, and the like). For example, in one instance, one or more contact terminals 108 may be arranged to be coupled to a first external circuit and one or more contact terminals 110 may be arranged to be concurrently coupled to a second (or other) external circuit. In various implementations, the contact terminals 108, 110 may be comprised of materials and have geometries (including package geometries and assembly characteristics) that are compatible to the first and second (or other) external circuits, respectively.

For example, in an implementation, as shown in FIG. 1, the IC 100 includes one or more openings such as spaces 112, orifices 114, or the like, through one or more layers 102, 104 to allow terminal contacts 108, 110 to extend from a lower layer to an upper layer (or a top level) or to be externally accessed through one or more layers 102, 104. In a first example, the arrangement of the metallic tracks of the layers 102, 104 creates a space 112, for example, where an interconnect 108 (e.g., a flip-chip bump, or the like) may extend from a lower layer (such as layer 102, for example) to the top of the stack, through the space 112 in the upper layer(s) 104. Thus, the interconnect 108 can extend from a lower layer 102 through an upper layer 104 without contacting the upper layer 104.

In another example, one or more conductive layers (such as layer 104, for example) of the stack may include orifices 114 (e.g., holes, apertures, etc.) or the like, where an interconnect 108 may extend from a lower layer (e.g., layer 102) to the top of the stack, though the orifice 114, without making contact with an upper layer 104 that the interconnect 108 passes through. In other implementations, a contact (110, for instance) may be electrically accessed through an opening 112, 114 in one or more layers 102, 104, from external to the IC 100.

In an implementation, the contact terminals 108, 110 coupled to the conductive layers 102, 104 respectively are comprised of different materials. For example, the contact terminals 108 coupled to the first layer 102 are comprised of a material compatible to the material of the first conductive layer 102 and the contact terminals 110 coupled to the second layer 104 are comprised of a material compatible to the material of the second conductive layer 104. In an illustrative implementation, the lower layer 102 is a copper layer and the contact terminals 108 are constructed of copper and solder. Further, in the illustrative implementation, the upper layer 104 is an aluminum-alloy layer and the contact terminals 110 are constructed of an aluminum alloy. In one case, the contact terminals 110 are constructed by etching the aluminum alloy layer 104, and freeing a pad portion from other coatings, coverings, and the like. In other cases, the contact terminals 110 are constructed using other techniques. The illustrated cases are not intended to be limiting, however, and other contact terminals 108, 110 of other materials may also be used when compatible with layer 102, 104 materials.

The strategic selection of compatible materials used to construct the contact terminals 108, 110 can improve mechanical and/or thermal performance of the contact terminals 108, 110, as well as their electrical performance. For example, the integrity and longevity of the mechanical coupling can be improved, as well as the transfer of heat or electricity, when more compatible materials are used for the contact terminals 108, 110 instead of other materials. Accordingly, this illustrates one advantage of the techniques and devices described herein, in contrast to the compromises inherent in using a single material for contacts 108, 110 on a final top metallization layer.

In an implementation, as shown in FIGS. 2-6, the IC arrangement 100 may include one or more protective layers, coatings, coverings, or the like, between layers and/or surrounding all of the layers. For example, the arrangement 100 may include a passivation layer 202 over one or more of the conductive layers 102, 104. In the example, the passivation layer 202 may be formed during manufacturing, and may be processed to include openings such as pad openings 204 in the passivation layer for electrical access to the contact terminals 110 on the conductive layer(s) 102, 104 below.

Figure 2:
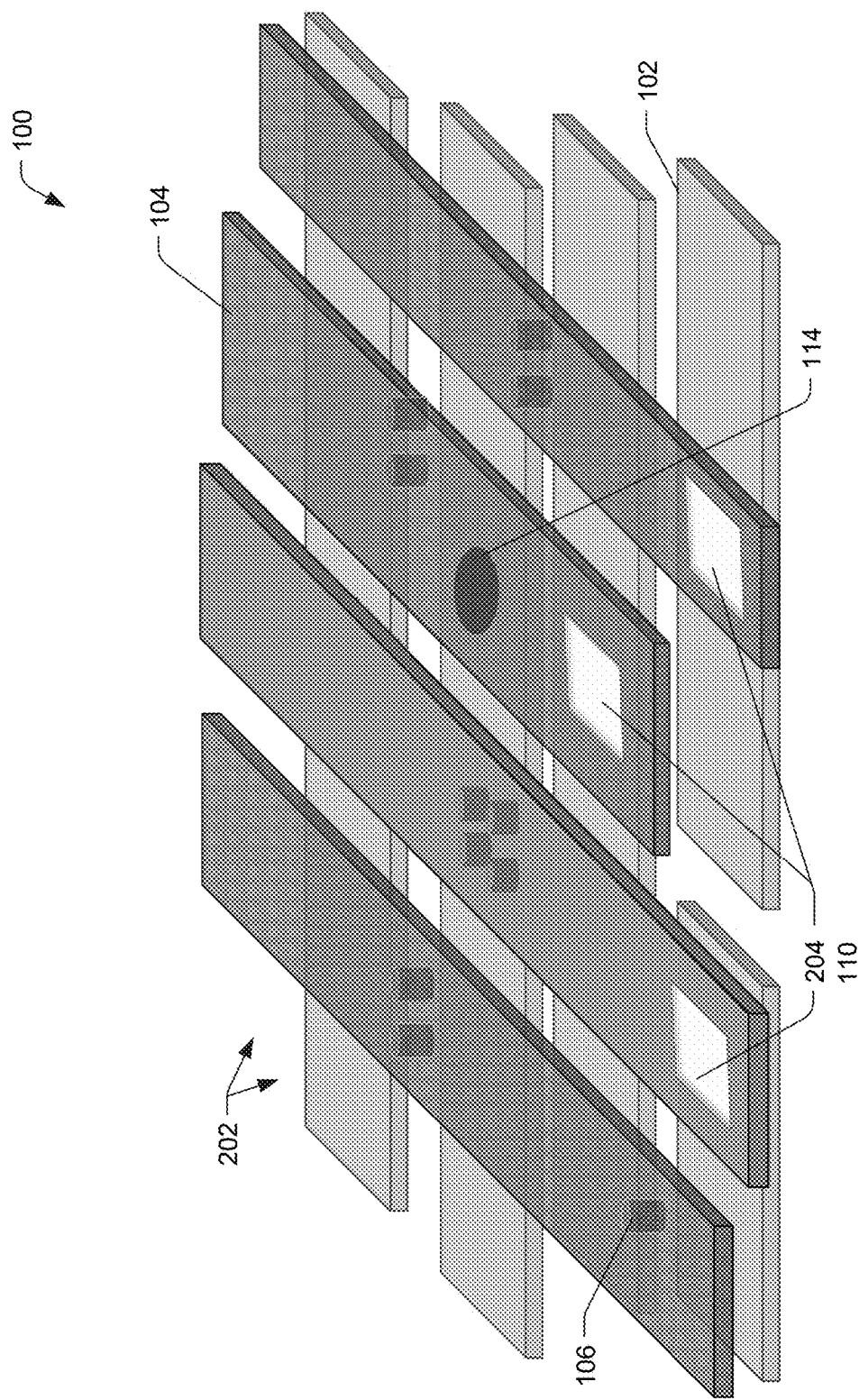
FIG. 2 is a perspective view of a multi-layer IC arrangement, detailing wafer testing probe access, according to an example.
Figure 3:
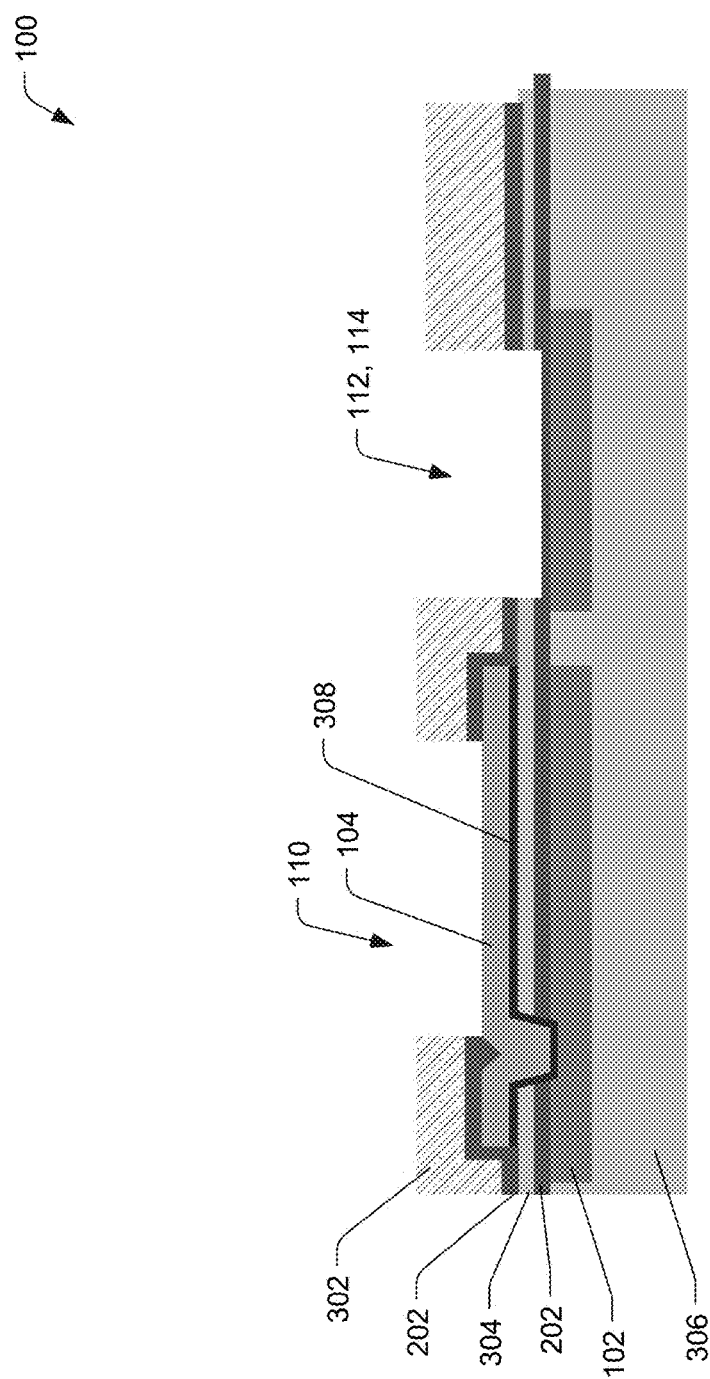
FIG. 3 is a profile view of the multi-layer IC arrangement of FIG. 2, showing an example integration of layers for wafer testing probe access, according to an example.

FIG. 3 is a profile view of the multi-layer IC arrangement 100, as depicted in FIG. 2, showing an example integration of layers, according to an example. In an implementation, the layers include the lower conductive layer 102 (e.g., copper layer), the upper conductive layer 104 (e.g., aluminum-alloy layer), and the passivation layers 202. Additional layers shown in FIG. 3 include a top level metallization 302, an insulating layer 304, a substrate layer 306, and an additional passivation layer (e.g., oxide/nitride deposition) 308. The contact terminal 110 is shown as an area of the upper conductive layer 104 that is exposed via an opening in layers above the layer 104. Also, an opening 112, 114 is shown, reflecting a space or an orifice in upper layers (104) that extends to the lower layer 102.

Figure 4:
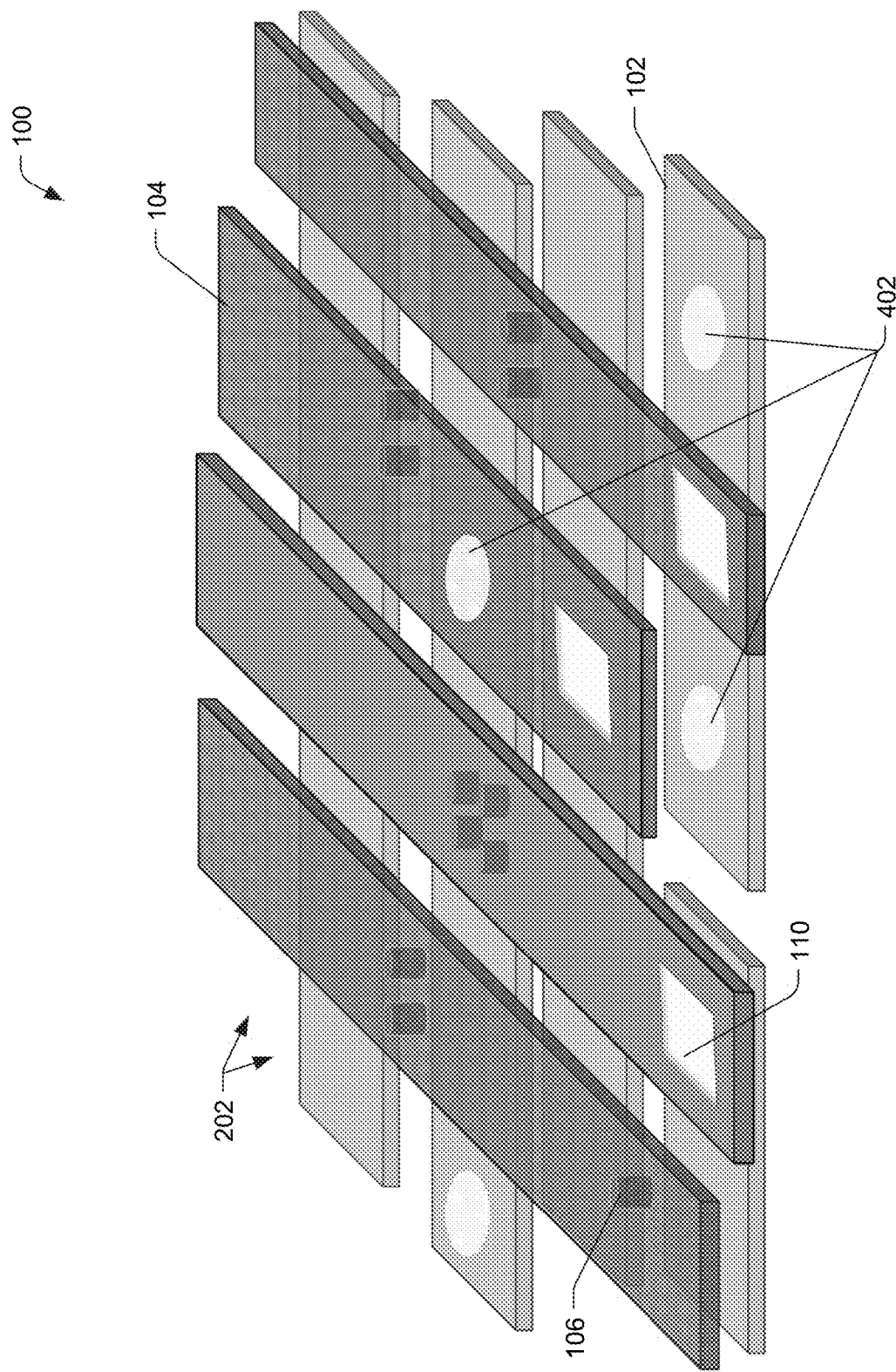
FIG. 4 is a perspective view of a multi-layer IC arrangement, detailing pre-bumping etching, according to an example.
Figure 5:
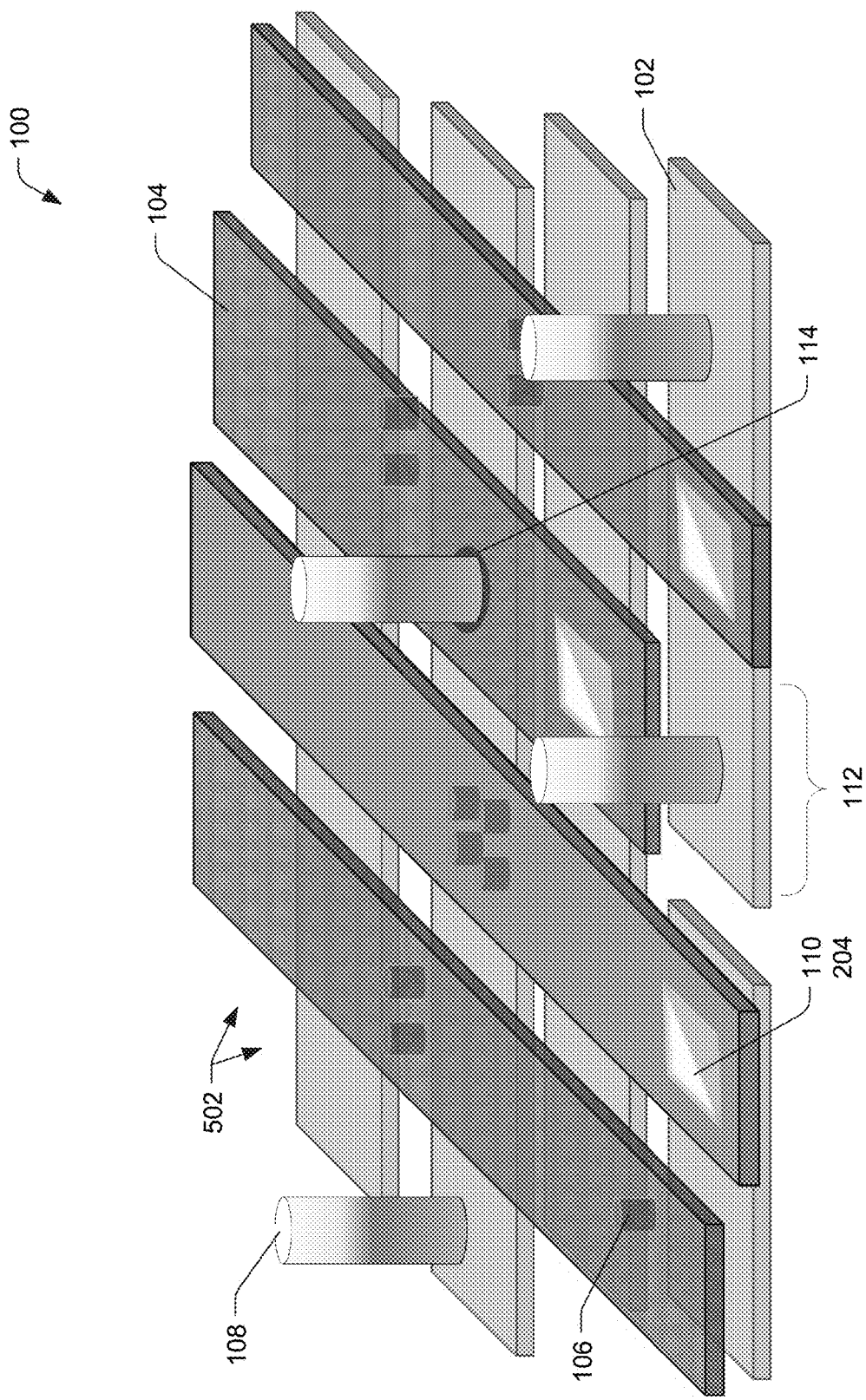
FIG. 5 is a perspective view of the multi-layer IC arrangement of FIG. 4, showing bump contacts formed, according to an example.

FIG. 4 is a perspective view of the multi-layer IC arrangement 100, detailing pre-bumping etching, according to an example. In an implementation, the passivation layer 202 and one or more other layers (e.g., insulating layers, etc.) may be etched 402, or the like to prepare the conductive layer (102, for example) to receive the contact terminals 108. The contact terminals 108 may be formed in the prepared locations, as shown in FIG. 5. For example, the contact terminals 108 may be formed of copper and solder, or the like, when the associated conductive layer is constructed of copper.

In another example, as shown in FIG. 5, the IC 100 may include a protective covering such as an imide coating 502 (e.g., thermoset, thermoplastic, etc.) enclosing the first conductive layer 102 and the second conductive layer 104 (and other layers if present). In an implementation, as shown in FIG. 5, the covering 502 is processed to include one or more openings 114, 204 in the protective covering 502 for electrical access to the contact terminals 108, 110. In some cases, the contact terminals (108, for example) protrude through the openings 114, 204 in the protective covering 502, so as to be electrically coupled to a circuit, or the like, external to the IC 100.

In an implementation, the IC 100 may include a "top level" (i.e., top of the stack) comprising the coating 502, an enclosure or package top, or the like, that is disposed over the stack, and includes multiple terminal pads (not shown) for electrically coupling the chip die 100 to an external system. In the implementation, the IC 100 includes multiple interconnects electrically coupling the electrical contact nodes (e.g., contact terminals 108, 110) of respective layers 102, 104 of the stack of metallic layers to individual terminal pads (e.g., wire bond connections, etc.) at the top level, without making contact with other layers 102, 104 of the stack of metallic layers.

In an implementation, the top level includes one or more openings that align with one or more other openings in at least one of the layers 102, 104. The openings are arranged to provide electrical access to contact terminals 108, 110 (e.g., contact nodes) on one or more metallic layers 102, 104 below. For example, the top level may include an opening that aligns with an opening (such as a space 112) on layer 104. The openings in the top level and on layer 104 may be aligned to allow electrical access to contact terminal 108 on layer 102 below.

Additionally, the openings in the top level and on the layer 104 may be aligned to allow the contact terminal 108 to extend through the layer 104 and through the top level as well. For example, this may be the case when the IC 100 comprises a flip-chip packaged integrated circuit (IC), or the like.

Figure 6:
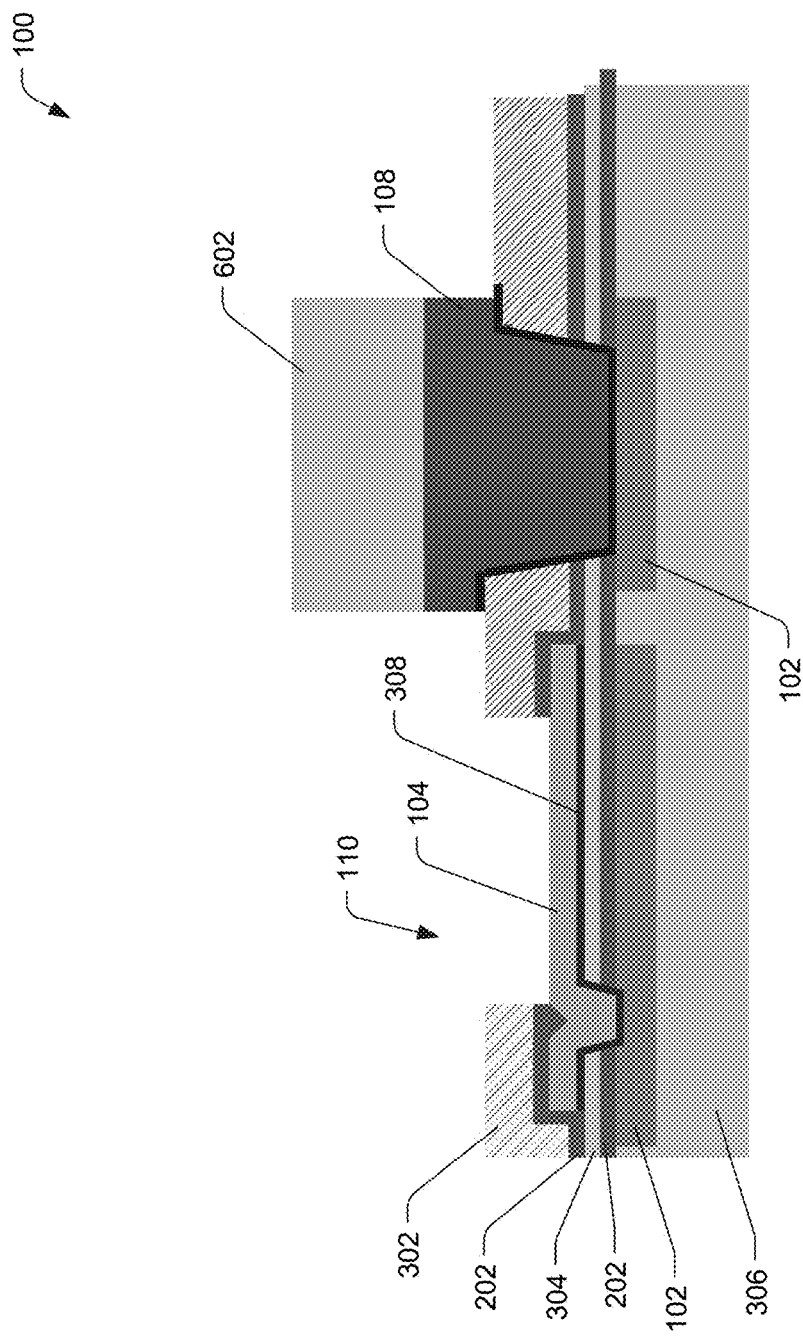
FIG. 6 is a profile view of the multi-layer IC arrangement of FIG. 5, showing an example integration of layers, including bump contact formation, according to an example.

FIG. 6 is a profile view of the multi-layer IC arrangement 100 depicted in FIG. 5, showing an example integration of layers, including bump contact 108 formation, according to an example. As shown in FIG. 6, the layers include the lower conductive layer 102 (e.g., copper layer), the upper conductive layer 104 (e.g., aluminum-alloy layer), and the passivation layers 202. Additional layers include a top level metallization 302, an insulating layer 304, a substrate layer 306, and an additional passivation layer (e.g., oxide/nitride deposition) 308. The contact terminal 110 is shown as an area of the upper conductive layer 104 that is exposed via an opening in layers above the layer 104. Also, the contact terminal 108 is shown, built up on the conductive layer 102. A solder portion 602 is also shown, built up on the base (e.g., copper) of the contact terminal 108, in preparation for connection of the contact terminal 108 to an external circuit or system.

Figure 7:
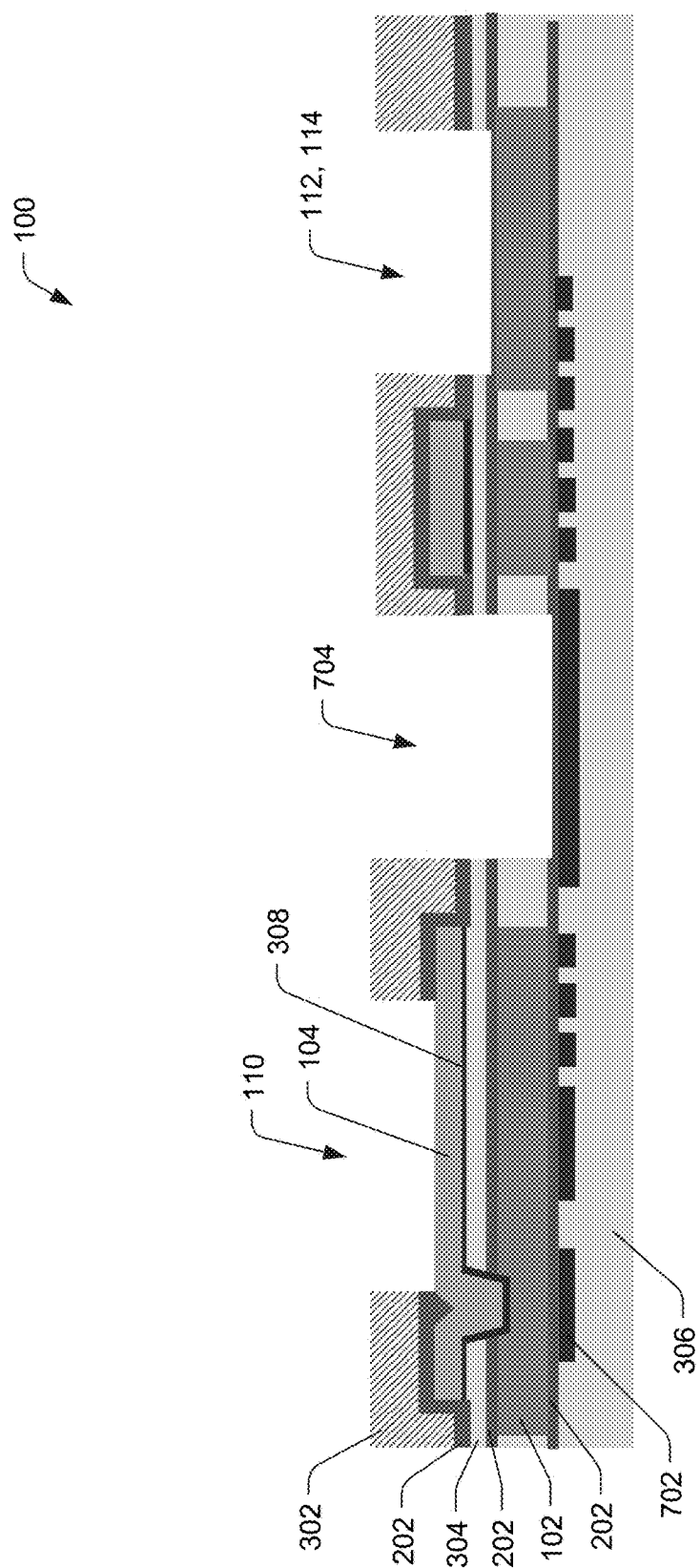
FIG. 7 is a profile view of another multi-layer IC arrangement, showing an example integration of additional layers, such as is used for System-In-Package (SIP) configurations with stacked dies, according to an example.

FIG. 7 is a profile view of another multi-layer IC arrangement 100, showing an example integration of additional layer(s) 702, such as is used for System-In-Package (SIP) configurations with stacked dies, according to an example.

For instance, in an implementation, the additional layer 702 comprises another conductive layer, similar to layers 102 and 104. In various implementations, an IC arrangement 100 may include any number of layers 102, 104, 702, as described above.

In an example, as shown in FIG. 7, the electrical coupling of interconnects (e.g., bumps, etc.) occurs on multiple layers. In an implementation, external terminals may be electrically coupled to three different layers of the chip metal stack.

In an implementation, at least one external terminal is coupled to layer 102, as shown at connection spaces 112, 114. For example, the spaces 112, 114 may provide connectivity to layer 102, which may be used for interconnecting to (or may function as) the supply layer of the chip. Also, at least one external terminal is coupled to layer 104, as shown at connection 110. For example, the space or opening 110 may provide connectivity to layer 104, which may be used for wafer testing the chip, bumps to power nets, or the like. Further, at least one external terminal is coupled to layer 702, as shown at connection 704. For example, the space or opening 704 may provide connectivity to layer 702, which may be used for access to (or may function as) the signal layer, or the like.

In an implementation, one of the contact levels (for instance contacts coupled to layer 104) may be used for external contacts with wire bonds, while other interconnects (e.g., flip chip bumps, etc.) are coupled to other layers (102, 702, etc.). In various implementations, this may include connection to interconnect bumps of another chip, as in so-called 2.5D stacked die implementations, for instance. In such implementations, more than one level (102, 104, 702, etc.) of interconnect contact may be used with one or more of the connected chips.

Different configurations for an IC arrangement 100 may be possible with different implementations. In alternate implementations, various other combinations and designs of the arrangement 100 are also within the scope of the disclosure. The variations may have fewer elements than illustrated in the examples shown in FIG. 1 through FIG. 6, or they may have more or alternative elements than those shown.

Representative Process

Figure 8:
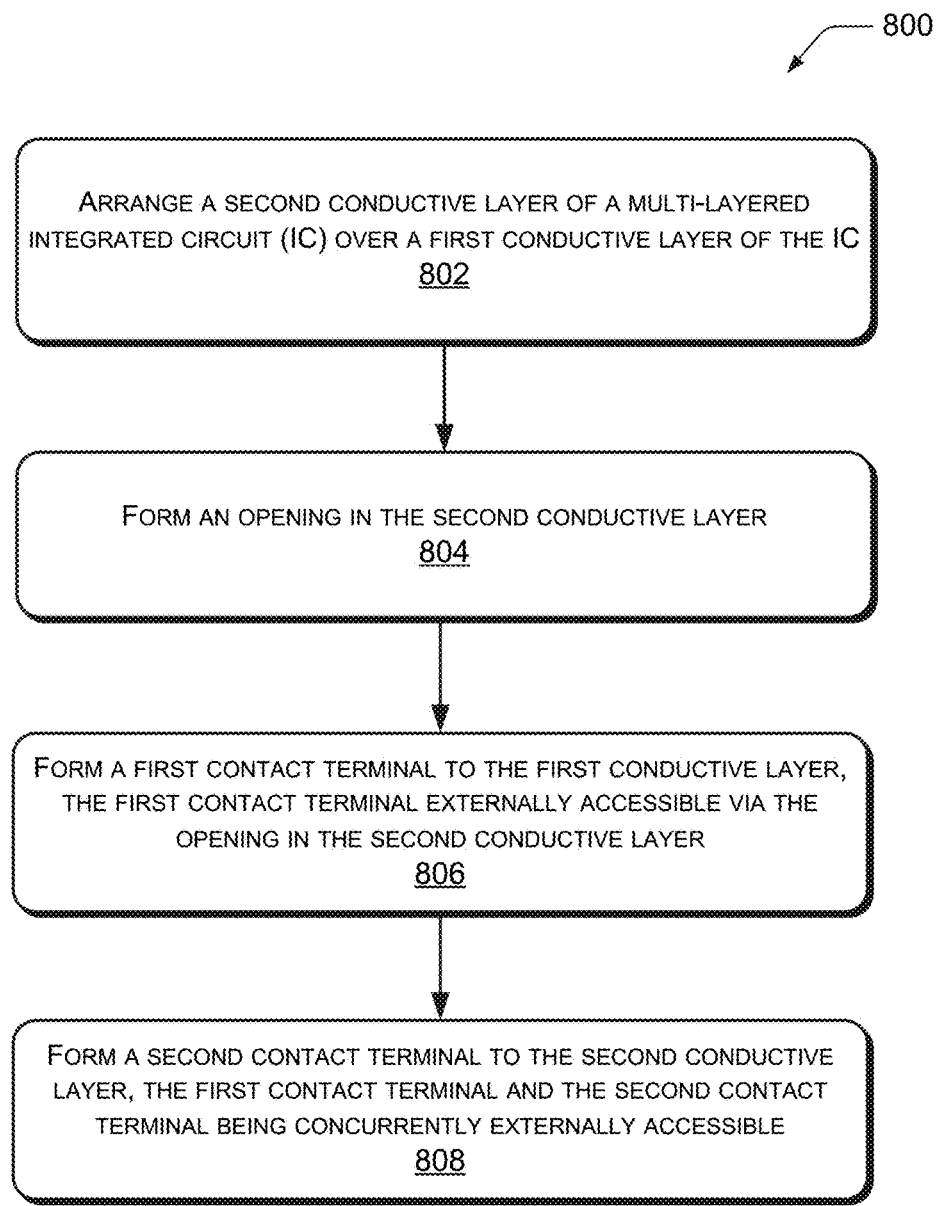
FIG. 8 is a flow diagram illustrating an example process for improving the electrical performance of chip contacts disposed on different layers of a multi-layer IC, according to an implementation.

FIG. 8 illustrates a representative process 800 for optimizing the electrical performance of chip interconnects (such as contact terminals 108, 110, for example) of a multi-layered IC (such as IC arrangement 100, for example), according to various implementations. In the implementations, different metallic layers (such as layers 102, 104, for example) of the chip are used to interconnect the chip with an external system, circuit, carrier, or the like. Additionally, in some implementations, the process 800 may improve mechanical and/or thermal performance of the chip interconnects, as well as improving manufacturing processes. The process 800 is described with reference to FIGS. 1-7.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 802, the process includes arranging a second conductive layer of a multi-layered integrated circuit (IC) over a first conductive layer of the IC. In an implementation, the first conductive layer is comprised of a different conductive material than the second conductive layer. In another implementation, the first conductive layer is comprised of a same conductive material as that of the second conductive layer. At block 804, the process includes forming an opening in the second conductive layer.

At block 806, the process includes forming a first contact terminal to the first conductive layer. In an implementation, the first contact terminal is externally accessible via the opening in the second conductive layer. In one example, the first contact terminal extends through the opening in the second conductive layer. In another example, the opening extends down to the first contact terminal, making it externally accessible.

In various implementations, the process includes fine-tuning electrical, mechanical, and/or thermal interconnect properties of the IC by strategically selecting materials for the first and second conductive layers and for the first and second contact terminals. For instance, in an implementation, the process includes forming the first contact terminal of a material that is compatible to the material of the first conductive layer and forming the second contact terminal of a material that is compatible to the material of the second conductive layer. In one example, the first contact terminal is constructed of the same material as the first conductive layer and the second contact terminal is constructed of the same material as the second conductive layer.

At block 808, the process includes forming a second contact terminal to the second conductive layer. In an implementation, the first contact terminal and the second contact terminal are formed and arranged to be concurrently externally accessible.

In various implementations, the process includes forming a top interconnect layer disposed above the first and second conductive layers, that includes at least one terminal pad for electrically coupling the IC to an external system. In the implementations, the process includes electrically coupling the terminal pad to the first contact terminal. In one implementation, the process includes forming an opening in the top interconnect layer, where the opening is arranged to provide external electrical access to the second contact terminal. In the implementation, the process includes electrically coupling another terminal pad of the top interconnect layer to the second contact terminal.

In a further implementation, the process includes fully or partially surrounding the first conductive layer and the second conductive layer within a protective covering. The process includes providing electrical access to the first contact terminal and/or the second contact terminal via one or more openings in the covering. For example, the process may include enclosing the IC in a flip-chip type package, where the top interconnect layer comprises a top portion of the flip-chip type package.

In various implementations, the process includes forming multiple conductive layers (e.g., beyond the first and second layers) in like manner within the IC. In the implementations, one or more openings or spaces are provided above each layer of the multiple conductive layers, such that external terminal connections may be made to the multiple conductive layers (or layer to layer connections may be made) through any layers above or between the respective layer and the external terminal(s) or layer(s). In some implementations, interconnect components (e.g., bumps, vias, etc.) are formed within the openings or spaces, are electrically coupled to desired layers, and may be insulated from other layers that the interconnect components pass through.

In alternate implementations, other techniques may be included in the process in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A multi-layered integrated circuit (IC), comprising: a first conductive layer comprising a first material;
   a first contact terminal coupled to the first conductive layer;
   a second conductive layer disposed over the first conductive layer, the second conductive layer comprising a second material;
   a second contact terminal coupled to the second conductive layer;
   at least one opening in the second conductive layer, the first contact terminal externally accessible via the at least one opening in the second conductive layer, such that the first contact terminal and the second contact terminal are concurrently externally accessible; and
   a protective covering enclosing the first and second conductive layers and including one or more openings in the protective covering for electrical access to at least one of the first and second contact terminals.

2. The multi-layered IC of claim 1, wherein the protective covering comprises a passivation layer.

3. The multi-layered IC of claim 1, further comprising a third conductive layer disposed below the first and second conductive layers, and further comprising one or more openings in the first and second conductive layers for electrical access to at least one contact at the third conductive layer with contact terminals.

4. The multi-layered IC of claim 1, wherein at least one of the first and second contact terminals protrudes through an opening in the protective covering, and is arranged to be electrically coupled to a circuit external to the IC.

5. The multi-layered IC of claim 4, wherein the first contact terminal is comprised of a first material set and has a package geometry compatible to the circuit external to the IC, and wherein the second contact terminal is arranged to be concurrently electrically coupled to a second circuit external to the IC and is comprised of a second material set and has a geometry compatible to the second circuit external to the IC.

6. The multi-layered IC of claim 1, further comprising an insulating layer disposed between at least a portion of the first conductive layer and the second conductive layer.

7. The multi-layered IC of claim 1, further comprising one or more vias coupled to the first conductive layer and/or the second conductive layer and extending to a lower layer of the IC.

8. The multi-layered IC of claim 1, wherein the first contact terminal protrudes through the at least one opening in the second conductive layer without making contact to the second conductive layer.

9. The multi-layered IC of claim 1, wherein the first material is the same as the second material.

10. The multi-layered IC of claim 1, wherein the first material is different than the second material.

11. The multi-layered IC of claim 10, wherein the first conductive layer comprises a metallization layer of a first metal and the second conductive layer comprises a metallization layer of a second, different metal.

12. The multi-layered IC of claim 1, wherein the first contact terminal and the second contact terminal are comprised of different materials, the first contact terminal being comprised of a material compatible to the first material of the first conductive layer and the second contact terminal being comprised of a material compatible to the second material of the second conductive layer.

13. The multi-layered IC of claim 1, wherein a portion of the first conductive layer is electrically coupled to a portion of the second conductive layer.

14. The multi-layered IC of claim 1, wherein the first contact terminal comprises a flip chip bump contact.

15. The multi-layered IC of claim 1, wherein the second contact terminal comprises a wafer test point.

16. A multi-layered integrated circuit (IC), comprising: a first layer comprising copper traces;
    at least one copper contact terminal coupled to the first layer;
    a second layer comprising aluminum-alloy traces, disposed over the first layer; at least one aluminum-alloy contact terminal coupled to the second layer; and
    at least one opening in the second layer, a copper contact terminal coupled to the first layer protruding through the at least one opening in the second layer without making contact with the second layer, the copper contact terminal and the aluminum-alloy contact terminal arranged to be concurrently electrically coupled to one or more circuits external to the IC.

17. A multi-layered chip die, comprising:
    a plurality of metallic layers arranged in a stack, and including electrical contact nodes;
    a top level disposed over the stack, and having multiple terminal pads for electrically coupling the chip die to an external system; and
    multiple interconnects electrically coupling the electrical contact nodes of respective layers of the plurality of metallic layers to individual terminal pads at the top level, without making contact with other layers of the plurality of metallic layers of the chip die.

18. The multi-layered chip die of claim 17, further comprising one or more openings in the top level and one or more openings in at least one layer of the plurality of metallic layers arranged to provide electrical access to one or more electrical contact nodes on one or more metallic layers below the at least one layer.

19. The multi-layered chip die of claim 17, wherein at least one layer of the plurality of metallic layers and at least one included contact node is comprised of copper and at least one other layer of the plurality of metallic layers and at least one other included contact node is comprised of an aluminum alloy.

20. The multi-layered chip die of claim 17, wherein the multi-layered chip die comprises a flip-chip packaged integrated circuit (IC).

21. A multi-layered integrated circuit (IC), comprising:
    a first conductive layer comprising a first material;
    a first contact terminal coupled to the first conductive layer;
    a second conductive layer disposed over the first conductive layer, the second conductive layer comprising a second material;
    a second contact terminal coupled to the second conductive layer; and at least one opening in the second conductive layer, the first contact terminal externally accessible via the at least one opening in the second conductive layer, such that the first contact terminal and the second contact terminal are concurrently externally accessible, wherein the first contact terminal protrudes through the at least one opening in the second conductive layer without making contact to the second conductive layer.

22. A multi-layered integrated circuit (IC), comprising:
a first conductive layer comprising a first material;
a first contact terminal coupled to the first conductive layer;
a second conductive layer disposed over the first conductive layer, the second conductive layer comprising a second material;
a second contact terminal coupled to the second conductive layer; and
at least one opening in the second conductive layer, the first contact terminal externally accessible via the at least one opening in the second conductive layer, such that the first contact terminal and the second contact terminal are concurrently externally accessible, wherein the first material is different than the second material.

23. The multi-layered IC of claim 22, wherein the first conductive layer comprises a metallization layer of a first metal and the second conductive layer comprises a metallization layer of a second, different metal.

24. A method, comprising:
arranging a second conductive layer of a multi-layered integrated circuit (IC) over a first conductive layer of the IC;
forming an opening in the second conductive layer;
forming a first contact terminal to the first conductive layer, the first contact terminal externally accessible via the opening in the second conductive layer;
forming a second contact terminal to the second conductive layer, the first contact terminal and the second contact terminal being concurrently externally accessible; and
forming a protective covering enclosing the first and second conductive layers and including one or more openings in the protective covering for electrical access to at least one of the first and second contact terminals.

25. The method of claim 24, further comprising forming a top interconnect layer disposed above the first and second conductive layers including at least one terminal pad for electrically coupling the IC to an external system, and electrically coupling the at least one terminal pad to the first contact terminal.

26. The method of claim 25, further comprising forming an opening in the top interconnect layer arranged to provide external electrical access to the second contact terminal.

27. The method of claim 25, further comprising electrically coupling another terminal pad of the top interconnect layer to the second contact terminal.

28. The method of claim 25, further comprising enclosing the IC in a flip-chip type package, the top interconnect layer comprising a top of the flip-chip type package.

29. The method of claim 24, further comprising forming the first contact terminal of a material compatible to the material of the first conductive layer and forming the second contact terminal of a material compatible to the material of the second conductive layer.

30. The method of claim 24, further comprising fine-tuning electrical, mechanical, and/or thermal interconnect properties of the IC by strategically selecting materials for the first and second conductive layers and for the first and second contact terminals.

31. The method of claim 24, wherein the first conductive layer comprises a different conductive material than the second conductive layer.

32. The method of claim 24, wherein the first conductive layer comprises a same conductive material as the second conductive layer.

* * * * *